United States Patent [19]
Han et al.

[11] Patent Number: 6,103,136
[45] Date of Patent: Aug. 15, 2000

[54] METHOD FOR FORMING A SOFT ADJACENT LAYER (SAL) MAGNETORESISTIVE (MR) SENSOR ELEMENT WITH TRANSVERSELY MAGNETICALLY BIASED SOFT ADJACENT LAYER (SAL)

[75] Inventors: Cherng-Chyi Han; Mao-Min Chen; Cheng Tzong Horng; Po-Kang Wang, all of San Jose; Chyu Jiuh Torng, Pleasanton; Kochan Ju, Fremont, all of Calif.

[73] Assignee: Headway Technologies, Inc., Milpitas, Calif.

[21] Appl. No.: 09/046,007

[22] Filed: Mar. 23, 1998

[51] Int. Cl.⁷ .................................. B44C 1/22; G11B 5/39
[52] U.S. Cl. ........................... 216/22; 360/113; 29/603.16
[58] Field of Search ........................... 216/22; 29/603.16; 360/113

[56] References Cited

U.S. PATENT DOCUMENTS

| | | | |
|---|---|---|---|
| 5,508,866 | 4/1996 | Gill et al. | 360/113 |
| 5,694,275 | 12/1997 | Watanabe et al. | 360/113 |
| 5,739,990 | 4/1998 | Ravipati et al. | 360/113 |
| 5,753,131 | 5/1998 | Choukh et al. | 216/22 |
| 5,754,376 | 5/1998 | Kobayashi et al. | 360/113 |
| 5,923,505 | 7/1999 | Kroes et al. | 360/113 |
| 5,992,004 | 11/1999 | Sato et al. | 29/603.14 |

*Primary Examiner*—Randy Gulakowski
*Assistant Examiner*—Shamim Ahmed
*Attorney, Agent, or Firm*—George O. Saile; Stephen B. Ackerman; Alek P. Szecsy

[57] ABSTRACT

A method for fabricating a soft adjacent layer (SAL) magnetoresistive (MR) sensor element and several soft adjacent layer (SAL) magnetoresistive (MR) sensor elements which may be fabricated employing the method. There is first provided a substrate. There is formed over the substrate a dielectric layer, where the dielectric layer has a first surface of the dielectric layer and a second surface of the dielectric layer opposite the first surface of the dielectric layer. There is also formed over the substrate a magnetoresistive (MR) layer contacting the first surface of the dielectric layer. There is also formed over the substrate a soft adjacent layer (SAL), where the soft adjacent layer (SAL) has a first surface of the soft adjacent layer (SAL) and a second surface of the soft adjacent layer (SAL). The first surface of the soft adjacent layer (SAL) contacts the second surface of the dielectric layer. Finally, there is also formed over the substrate a transverse magnetic biasing layer, where the transverse magnetic biasing layer contacts the second surface of the soft adjacent layer (SAL), and where at least one of the dielectric layer, the magnetoresistive (MR) layer, the soft adjacent layer (SAL) and the transverse magnetic biasing layer is a patterned layer formed employing an etch mask which serves as a lift-off stencil for forming a patterned second dielectric layer adjoining an edge of the patterned layer. The invention also contemplates a soft adjacent layer (SAL) magnetoresistive (MR) sensor element formed with the magnetoresistive (MR) layer interposed between the substrate and the soft adjacent layer (SAL). Similarly, the invention also contemplates a soft adjacent layer (SAL) magnetoresistive (MR) sensor element employing a transverse magnetic biasing layer formed of a hard bias permanent magnet material.

8 Claims, 5 Drawing Sheets

METHOD FOR FORMING A SOFT ADJACENT LAYER (SAL) MAGNETORESISTIVE (MR) SENSOR ELEMENT WITH TRANSVERSELY MAGNETICALLY BIASED SOFT ADJACENT LAYER (SAL)

BACKGROUND OF THE INVENTION

1. Field of the Invention

The present invention relates generally to methods for fabricating magnetic sensor elements. More particularly, the present invention relates to methods for fabricating soft adjacent layer (SAL) magnetoresistive (MR) sensor elements.

2. Description of the Related Art

The recent and continuing advances in computer and information technology have been made possible not only by the correlating advances in the functionality, reliability and speed of semiconductor integrated circuits, but also by the correlating advances in the storage density and reliability of direct access storage devices (DASDs) employed in digitally encoded magnetic data storage and retrieval.

Storage density of direct access storage devices (DASDs) is typically measured as areal storage density of a magnetic data storage medium formed upon a rotating magnetic data storage disk within a direct access storage device (DASD) magnetic data storage enclosure. The areal storage density of the magnetic data storage medium is defined largely by the track width, the track spacing and the linear magnetic domain density within the magnetic data storage medium. The track width, the track spacing and the linear magnetic domain density within the magnetic data storage medium are in turn determined by several principal factors, including but not limited to: (1) the magnetic read-write characteristics of a magnetic read-write head employed in reading and writing digitally encoded magnetic data from and into the magnetic data storage medium; (2) the magnetic domain characteristics of the magnetic data storage medium; and (3) the separation distance of the magnetic read-write head from the magnetic data storage medium.

With regard to the magnetic read-write characteristics of magnetic read-write heads employed in reading and writing digitally encoded magnetic data from and into a magnetic data storage medium, it is known in the art of magnetic read-write head fabrication that magnetoresistive (MR) read-write heads are generally superior to other types of magnetic read-write heads when employed in retrieving digitally encoded magnetic data from a magnetic data storage medium. In that regard, magnetoresistive (MR) read-write heads are generally regarded as superior since magnetoresistive (MR) read-write heads are known in the art to provide high output digital read signal amplitudes, with good linear resolution, independent of the relative velocity of a magnetic data storage medium with respect to a magnetoresistive (MR) read-write head.

In order to optimize signal amplitude and performance of a magnetoresistive (MR) read-write head, it is known in the art of magnetoresistive (MR) read-write head fabrication to employ at least either: (1) a longitudinal magnetic biasing to a magnetoresistive (MR) layer within a magnetoresistive (MR) sensor element within the magnetoresistive (MR) read-write head (in order to provide noise free operation of the magnetoresistive (MR) sensor element); or (2) a transverse magnetic biasing to the magnetoresistive (MR) layer within the magnetoresistive (MR) sensor element within the magnetoresistive (MR) read-write head (in order to provide a linear response of the magnetoresistive (MR) sensor element). Longitudinal magnetic biasing is typically provided employing either: (1) antiferromagnetic coupling of patterned antiferromagnetic material layers contacting opposite ends of the magnetoresistive (MR) layer within the magnetoresistive (MR) sensor element; or (2) permanent magnetic coupling of patterned permanent magnetic layers contacting opposite ends of the magnetoresistive (MR) layer within the magnetoresistive (MR) sensor element, while transverse magnetic biasing is typically provided through forming either in contact with or separated from the magnetoresistive (MR) layer by a conductor spacer layer a soft adjacent layer (SAL) of soft magnetic material, typically at least substantially co-extensive with the magnetoresistive (MR) layer within the magnetoresistive (MR) sensor element.

While transverse magnetically biased soft adjacent layer (SAL) magnetoresistive (MR) sensor elements provide generally enhanced linearity and performance with respect to otherwise equivalent magnetoresistive (MR) sensor elements absent soft adjacent layer (SAL) transverse magnetic biasing, soft adjacent layer (SAL) magnetoresistive MR) sensor elements are not formed entirely without problems. In particular, soft adjacent layer (SAL) magnetoresistive (MR) sensor elements when conventionally fabricated with a conductor spacer layer or soft adjacent layer (SAL) contacting a magnetoresistive (MR) layer within the soft adjacent layer (SAL) magnetoresistive (MR) sensor element suffer from problems including but not limited to: (1) current shunting through either one or both of the conductor spacer layer and the soft adjacent layer (SAL) (which leads to reduced signal amplitude of the magnetoresistive (MR) sensor element); and (2) thermal annealing induced elemental interdiffusion of the conductor spacer layer or the soft adjacent layer (SAL) with the magnetoresistive (MR) layer (which similarly also leads to reduced signal amplitude of the magnetoresistive (MR) sensor element). Similarly, soft adjacent layer (SAL) magnetoresistive (MR) sensor elements as conventionally fabricated do not necessarily always provide for optimal transverse magnetic biasing between a soft adjacent layer (SAL) and a magnetoresistive (MR) layer. It is thus towards the goal of fabricating soft adjacent layer (SAL) magnetoresistive (MR) sensor elements which simultaneously avoid: (1) current shunting into conductor spacer layers or soft adjacent layers (SALs) contacting magnetoresistive (MR) layers within the soft adjacent layer (SAL) magnetoresistive (MR) sensor elements; and (2) thermal annealing induced elemental inter-diffusion of conductor spacer layers or soft adjacent layers (SALs) contacting magnetoresistive (MR) layers within those soft adjacent layer (SAL) magnetoresistive (MR) sensor elements, while providing enhanced transverse magnetic biasing between a soft adjacent layer (SAL) and a magnetoresistive (MR) layer within the soft adjacent layer (SAL) magnetoresistive (MR) sensor element, that the present invention is directed.

Various soft adjacent layer (SAL) magnetoresistive (MR) sensor elements have been disclosed in the art of magnetoresistive (MR) sensor element fabrication.

For example, Gill et al., in U.S. Pat. No. 5,508,866, discloses a soft adjacent layer (SAL) magnetoresistive (MR) sensor element comprising an exchange coupled antiferromagnetic bias layer contacting a soft adjacent layer (SAL) within the soft adjacent layer (SAL) magnetoresistive (MR) sensor element. The exchange coupled antiferromagnetic bias layer assures that the soft adjacent layer is fully saturated in a preferred direction.

In addition, Batra, in U.S. Pat. No. 5,483,402, discloses a soft adjacent layer (SAL) magnetoresistive (MR) sensor element having electrical leads whose planar surfaces are canted with respect to the easy axis of magnetization of a magnetoresistive (MR) layer within the soft adjacent layer (SAL) magnetoresistive (MR) sensor element. The soft adjacent layer (SAL) magnetoresistive (MR) sensor element so formed has a more symmetrical off-track performance profile which minimizes differences between the physical center of the soft adjacent layer (SAL) magnetoresistive (MR) sensor element and the magnetic center of the soft adjacent layer (SAL) magnetoresistive (MR) sensor element.

Further, Nix et al., in U.S. Pat. No. 5,573,809 disclose a soft adjacent layer (SAL) magnetoresistive (MR) sensor element comprising a magnetoresistive (MR) layer having a permanent magnet layer formed at each of its ends, where the magnetoresistive (MR) layer and the permanent magnet layers are separated by a tantalum or titanium spacer layer from a soft adjacent layer (SAL) within the soft adjacent layer (SAL) magnetoresistive sensor element. The soft adjacent layer (SAL) magnetoresistive (MR) sensor element so formed has a natural magnetic flux closure design.

Finally, Gill, in U.S. Pat. No. 5,715,120, discloses a soft adjacent layer (SAL) magnetoresistive (MR) sensor element employing a dielectric spacer layer separating a soft adjacent layer (SAL) from a magnetoresistive (MR) layer within the soft adjacent layer (SAL) magnetoresistive (MR) sensor element, where the soft adjacent layer (SAL) is further biased with an antiferromagnetic material layer contacting a surface of the soft adjacent layer (SAL) opposite the dielectric layer. The soft adjacent layer (SAL) magnetoresistive (MR) sensor element so formed exhibits an improved magnetoresistive (MR) effect due to attenuated magnetoresistive (MR) sense current losses into the soft adjacent layer (SAL).

Desirable in the art of soft adjacent layer (SAL) magnetoresistive (MR) sensor element fabrication are additional soft adjacent layer (SAL) magnetoresistive (MR) sensor elements which avoid: (1) signal amplitude degradation due to current shunting of conductor spacer layers or soft adjacent layers (SALs) contacting magnetoresistive (MR) layers within those soft adjacent layer (SAL) magnetoresistive (MR) sensor elements; and (2) signal amplitude degradation due to thermal annealing induced elemental interdiffusion of magnetoresistive (MR) layers with conductor spacer layers or soft adjacent layers (SALs) contacting those magnetoresistive (MR) layers within those soft adjacent layer (SAL) magnetoresistive (MR) sensor elements, while providing enhanced transverse magnetic biasing between a soft adjacent layer (SAL) and a magnetoresistive (MR) layer within the soft adjacent layer (SAL) magnetoresistive (MR) sensor elements. More desirable in the art are soft adjacent layer (SAL) magnetoresistive (MR) sensor elements which realize the foregoing objects while simultaneously being readily manufacturable. It is towards the foregoing goals that the present invention is more specifically directed.

SUMMARY OF THE INVENTION

A first object of the present invention is to provide a soft adjacent layer (SAL) magnetoresistive (MR) sensor element and a method for fabricating the soft adjacent layer (SAL) magnetoresistive (MR) sensor element, wherein there is avoided signal amplitude degradation of the soft adjacent layer (SAL) magnetoresistive (MR) sensor element due to current shunting through a conductor spacer layer or soft adjacent layer (SAL) contacting the magnetoresistive (MR) layer within the soft adjacent layer (SAL) magnetoresistive (MR) sensor element.

A second object of the present invention is to provide a soft adjacent layer (SAL) magnetoresistive (MR) sensor element and a method for fabricating the soft adjacent layer (SAL) magnetoresistive (MR) sensor element, wherein there is avoided signal amplitude degradation of the soft adjacent layer (SAL) magnetoresistive (MR) sensor element due to thermal annealing induced elemental interdiffusion of a conductor spacer layer or soft adjacent layer (SAL) contacting the magnetoresistive (MR) layer within the soft adjacent layer (SAL) magnetoresistive (MR) sensor element.

A third object of the present invention is to provide a soft adjacent layer (SAL) magnetoresistive (MR) sensor element and a method for fabricating the soft adjacent layer (SAL) magnetoresistive (MR) sensor element in accord with the first object of the present invention or the second object of the present invention, where there is provided enhanced transverse magnetic biasing between a soft adjacent layer (SAL) and a magnetoresistive (MR) layer within the soft adjacent layer (SAL) magnetoresistive (MR) sensor element.

A fourth object of the present invention is to provide a soft adjacent layer (SAL) magnetoresistive (MR) sensor element in accord with the first object of the present invention, the second object of the present invention or the third object of the present invention, where the method through which is fabricated the soft adjacent layer (SAL) magnetoresistive (MR) sensor element is readily commercially implemented.

In accord with the objects of the present invention, there is provided a method for forming a soft adjacent layer (SAL) magnetoresistive (MR) sensor element. To practice the method of the present invention, there is first provided a substrate. There is then formed over the substrate a dielectric spacer layer, where the dielectric spacer layer has a first surface of the dielectric spacer layer and a second surface of the dielectric spacer layer opposite the first surface of the dielectric spacer layer. There is also formed over the substrate a magnetoresistive (MR) layer contacting the first surface of the dielectric spacer layer. There is also formed over the substrate a soft adjacent layer (SAL), where the soft adjacent layer (SAL) has a first surface of the soft adjacent layer (SAL) and a second surface of the soft adjacent layer (SAL) opposite the first surface of the soft adjacent layer. The first surface of the soft adjacent layer (SAL) contacts the second surface of the dielectric spacer layer. Finally, there is also formed over the substrate a transverse magnetic biasing layer, where the transverse magnetic biasing layer contacts the second surface of the soft adjacent layer (SAL). Within the method of the present invention, at least one of the dielectric spacer layer, the magnetoresistive (MR) layer, the soft adjacent layer (SAL) and the transverse magnetic biasing layer is a patterned layer formed employing as an etch mask a lift-off stencil which is employed for forming a patterned second dielectric layer adjoining an edge of the patterned layer.

The method of the present invention also contemplates several soft adjacent layer (SAL) magnetoresistive (MR) sensor elements formed in accord with the method of the present invention, where the soft adjacent layer (SAL) magnetoresistive (MR) sensor elements are formed: (1) with the magnetoresistive (MR) layer formed interposed between the substrate and the soft adjacent layer (SAL); or (2) with the transverse magnetic biasing layer formed of a hard bias permanent magnet material.

There is provided by the present invention a soft adjacent layer (SAL) magnetoresistive (MR) sensor element and a method for fabricating the soft adjacent layer (SAL) magnetoresistive (MR) sensor element, where there is avoided signal amplitude degradation of the soft adjacent layer (SAL) magnetoresistive (MR) sensor element due to either: (1) current shunting through a conductor spacer layer or soft adjacent layer (SAL) contacting the magnetoresistive (MR) layer within the soft adjacent layer (SAL) magnetoresistive (MR) sensor element; or (2) thermal annealing induced elemental interdiffusion of a conductor spacer layer or soft adjacent layer (SAL) contacting the magnetoresistive (MR) layer within the soft adjacent layer (SAL) magnetoresistive (MR) sensor element. The present invention realizes the foregoing objects by forming within the soft adjacent layer (SAL) magnetoresistive (MR) sensor element of the present invention a magnetoresistive (MR) layer separated from a soft adjacent layer (SAL) by a dielectric spacer layer rather than a conductor spacer layer.

There is provided by the present invention a soft adjacent layer (SAL) magnetoresistive (MR) sensor element, where there is provided enhanced transverse magnetic biasing by a soft adjacent layer (SAL) of a magnetoresistive (MR) layer within the soft adjacent layer (SAL) magnetoresistive (MR) sensor element. The present invention realizes this object by employing a transverse magnetic biasing layer formed contacting a surface of the soft adjacent layer (SAL) opposite the magnetoresistive (MR) layer.

The method through which is formed the soft adjacent layer (SAL) magnetoresistive (MR) sensor element of the present invention is readily commercially implemented. As is illustrated within the preferred embodiment of the present invention, the soft adjacent layer (SAL) magnetoresistive (MR) sensor element of the present invention may be formed employing a photolithographic and etch method employing fabrication apparatus generally known within the art of magnetic read-write head fabrication. Thus, the method through which is formed the soft adjacent layer (SAL) magnetoresistive (MR) sensor element of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENT

The present invention provides a soft adjacent layer (SAL) magnetoresistive (MR) sensor element and a method for fabricating the soft adjacent layer (SAL) magnetoresistive (MR) sensor element, wherein there is avoided: (1) signal amplitude degradation of the soft adjacent layer (SAL) magnetoresistive (MR) sensor element due to current shunting through a conductor spacer layer or soft adjacent layer (SAL) contacting the magnetoresistive (MR) layer within the soft adjacent layer (SAL) magnetoresistive (MR) sensor element; and (2) signal amplitude degradation of the soft adjacent layer (SAL) magnetoresistive (MR) sensor element due to thermal annealing induced elemental interdiffusion of a conductor spacer layer or soft adjacent layer (SAL) contacting the magnetoresistive (MR) layer within the soft adjacent layer (SAL) magnetoresistive (MR) sensor element, while simultaneously providing a soft adjacent layer (SAL) magnetoresistive (MR) sensor element with enhanced transverse magnetic biasing by a soft adjacent layer (SAL) of a magnetoresistive (MR) layer within the soft adjacent layer (SAL) magnetoresistive (MR) sensor element. The present invention realizes the foregoing objects by employing when forming the soft adjacent layer (SAL) magnetoresistive (MR) sensor element a magnetoresistive (MR) layer separated from a soft adjacent layer (SAL) by a dielectric spacer layer, where there is formed contacting a surface of the soft adjacent layer (SAL) opposite the magnetoresistive (MR) layer a transverse magnetic biasing layer.

Although the soft adjacent layer (SAL) magnetoresistive (MR) sensor element of the present invention may be employed in fabricating soft adjacent layer (SAL) magnetoresistive (MR) sensors employed in various applications, including but not limited to analog magnetic signal sensing applications and digital magnetic signal sensing applications, the soft adjacent layer (SAL) magnetoresistive (MR) sensor element of the present invention is preferably employed within, and particularly suited to forming, a magnetoresistive (MR) read-write head employed in reading and writing digitally encoded magnetic data from and into a magnetic data storage medium employed within a direct access storage device (DASD) employed within digitally encoded magnetic data storage and retrieval.

Figure 1:
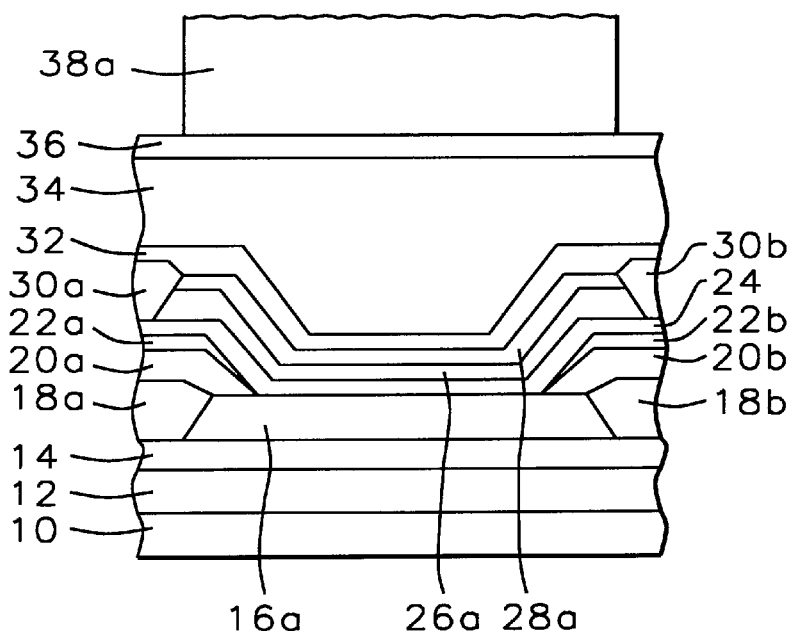
FIG. 1 and FIG. 2 show a pair of schematic cross-sectional or air bearing surface (ABS) view diagrams illustrating two preferred embodiments of a magnetic read-write head having incorporated therein a soft adjacent layer (SAL) magnetoresistive (MR) sensor element which may be formed employing the method of the present invention.
Figure 2:
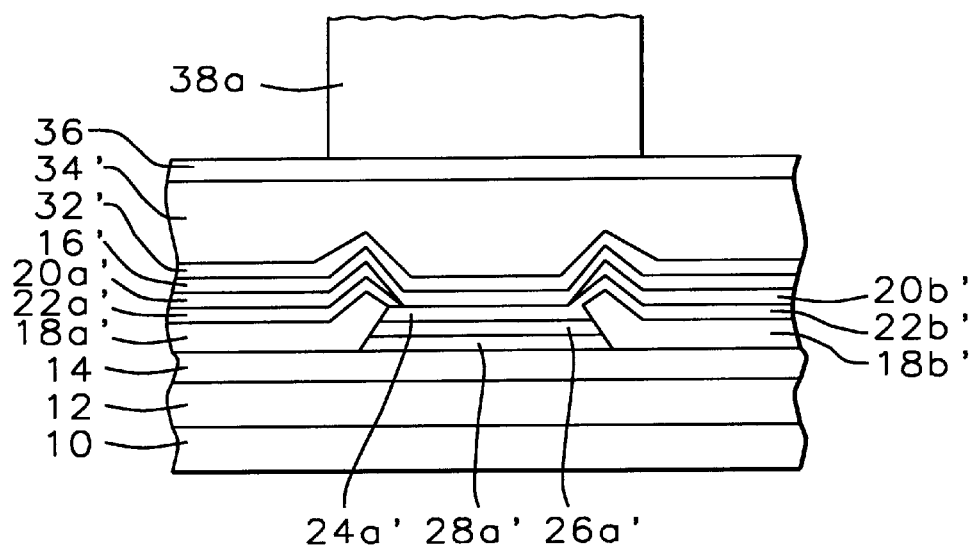

Referring now to FIG. 1 and FIG. 2, there is shown a pair of schematic cross-sectional or air bearing surface (ABS) diagrams illustrating two preferred embodiments of a magnetic read-write head having incorporated therein a soft adjacent layer (SAL) magnetoresistive (MR) sensor element which may be formed in accord with the present invention. Shown in FIG. 1 is a schematic cross-sectional diagram of a first of the two embodiments of the magnetic read-write head.

Shown in FIG. 1 is a substrate 10, having formed thereupon a blanket first shield layer 12 which in turn has formed thereupon a blanket first dielectric layer 14. Formed upon the blanket first dielectric layer 14 is a patterned magnetoresistive (MR) layer 16a, along with a pair of patterned second dielectric backfill layers 18a and 18b. Formed upon the pair of patterned second dielectric backfill layers 18a and 18b and bridging to a pair of opposite ends of the patterned magnetoresistive (MR) layer 16a is a pair of patterned longitudinal magnetic biasing layers 20a and 20b, which in turn have formed thereupon a corresponding pair of patterned conductor lead layers 22a and 22b. Formed upon the patterned magnetoresistive (MR) layer 16a and the pair of patterned conductor lead layers 22a and 22b is a blanket third dielectric soft adjacent layer (SAL) spacer layer 24. Formed upon the blanket third dielectric soft adjacent layer (SAL) spacer layer 24 is a patterned soft adjacent layer (SAL) transverse magnetic biasing layer 26a having formed and aligned thereupon a patterned transverse magnetic biasing layer 28a, where the exposed ends of each of the two foregoing layers are encapsulated with a pair of patterned fourth dielectric backfill layers 30a and 30b. Formed upon the pair of patterned fourth dielectric backfill layers 30a and 30b, and the patterned transverse magnetic biasing layer 28a is a blanket fifth dielectric layer 32. Formed upon the blanket fifth dielectric layer 32 is a blanket second shield layer 34 which simultaneously serves as a first magnetic inductor pole layer. Formed upon the blanket second shield layer 34 is a blanket sixth dielectric gap filling layer 36. Finally, formed upon the blanket sixth dielectric gap filling layer 36 is a patterned second magnetic inductor pole layer 38a.

The blanket second shield layer 34, the blanket sixth dielectric gap filling layer 36 and the patterned second magnetic inductor pole layer 38a in the aggregate form a write head element of the merged inductive write magnetoresistive (MR) read soft adjacent layer (SAL) magnetoresistive (MR) magnetic read-write head whose schematic cross-sectional diagram is illustrated in FIG. 1.

Within the present invention and the preferred embodiment of the present invention, a soft adjacent layer (SAL) magnetoresistive (MR) sensor element having formed therein a magnetoresistive (MR) layer, such as the patterned magnetoresistive (MR) layer 16a, is preferably formed centered within a magnetic write gap width of a magnetic read-write head, such as the magnetic write gap width defined by the width of the patterned second magnetic inductor pole layer 38a with respect to the blanket second shield layer 34. Similarly, within the present invention and the preferred embodiment of the present invention, a soft adjacent layer (SAL) magnetoresistive (MR) sensor element, such as the soft adjacent layer (SAL) magnetoresistive (MR) sensor element having formed therein the patterned magnetoresistive (MR) layer 16a, is also preferably formed centered within a read gap thickness of a magnetic read-write head, such as the read gap thickness defined by a separation of the blanket first shield layer 12 and the blanket second shield layer 34.

Within the present invention and the preferred embodiment of the present invention, a trackwidth of a magnetoresistive (MR) layer, such as a trackwidth of the patterned magnetoresistive (MR) layer 16a defined by a separation width of the pair of patterned conductor lead layers 22a and 22b, is preferably less than and contained within a width of a soft adjacent layer (SAL) transverse magnetic biasing layer, such as the patterned soft adjacent layer (SAL) transverse magnetic biasing layer 26a, and a width of a transverse magnetic biasing layer, such as the patterned transverse magnetic biasing layer 28a, formed adjacent thereto. Under such circumstances, there exists uniform biasing of the magnetoresistive (MR) layer at all locations within its trackwidth.

Within the magnetic read-write head whose schematic cross-sectional diagram is illustrated in FIG. 1, each of the foregoing substrate and layers may be formed employing materials disclosed as follows.

With respect to the substrate 10, although it is known in the art of magnetoresistive (MR) sensor element fabrication that substrates within soft adjacent layer (SAL) magnetoresistive (MR) sensor element fabrication are typically formed from non-magnetic ceramic materials such as but not limited to oxides, nitrides, borides, carbides and mixtures or composites of oxides, nitrides, borides and carbides, for the preferred embodiments of the present invention, the substrate 10 is preferably formed from a non-magnetic aluminum oxide/titanium carbide ceramic material. Preferably, the substrate 10 so formed is formed with sufficient dimensions to allow the substrate 10 to be fabricated into a slider employed within a direct access storage device (DASD) magnetic data storage enclosure employed within digitally encoded magnetic data storage and retrieval.

Similarly, although several soft magnetic materials are known in the art from which may be formed the blanket first shield layer 12, the patterned magnetoresistive (MR) layer 16a, the patterned soft adjacent layer (SAL) transverse magnetic biasing layer 26a, the blanket second shield layer 34 and the patterned second magnetic inductor pole layer 38a, each of the foregoing layers is preferably formed from a soft magnetic material selected from the group consisting of nickel-iron (permalloy) alloys, higher order alloys incorporating nickel-iron alloys (specific examples of which are nickel-iron-rhodium alloys and nickel-iron-chromium alloys) and cobalt-zirconium amorphous alloys (specific examples of which are cobalt-zirconium-tantalum amorphous alloys and cobalt-zirconium-niobium amorphous alloys).

It is advantageous within the present invention that the blanket shield layer 12, and in particular the patterned magnetoresistive layer 16a and the patterned soft adjacent layer (SAL) transverse magnetic biasing layer 26a may simultaneously be formed from the same soft magnetic material. Such advantage relates in large part to manufacturing efficiency and economy. Significantly, such advantage is inherently not realized within soft adjacent layer (SAL) magnetoresistive (MR) sensor elements where a soft adjacent layer (SAL) contacts a magnetoresistive (MR) layer within the soft adjacent layer (SAL) magnetoresistive (MR) sensor element.

With respect to the first dielectric layer 14, the patterned second dielectric backfill layers 18a and 18b, the blanket third dielectric soft adjacent layer (SAL) spacer layer 24, the patterned fourth dielectric backfill layers 30a and 30b, the blanket fifth dielectric layer 32 and the blanket sixth dielectric gap fill layer 36, although each of the foregoing dielectric layers may be formed employing methods and materials as are conventional in the art of soft adjacent layer (SAL) magnetoresistive (MR) sensor element fabrication, including but not limited to chemical vapor deposition (CVD) methods, plasma enhanced chemical vapor deposition (PECVD) methods and physical vapor deposition (PVD) sputtering methods which may be employed when forming dielectric layers of dielectric materials including but not limited to silicon oxide dielectric materials, silicon nitride dielectric materials, nitrogenated carbon dielectric materials and aluminum oxide dielectric materials, for the preferred embodiments of the present invention each of the foregoing dielectric layers is preferably formed of an aluminum oxide dielectric material deposited employing a physical vapor deposition (PVD) sputtering method, as is most common in the art of magnetoresistive (MR) sensor element fabrication.

With respect to the patterned longitudinal magnetic biasing layers 20a and 20b, and the patterned transverse magnetic biasing layer 28a, each of those layers is formed of a high coercivity magnetic material having a coercivity from about 100 to about 2000 oersteds, more preferably from about 1200 to about 1600 oersteds. Such magnetic materials may be selected from the group of magnetic materials including but not limited to antiferromagnetic materials (such as but not limited to iron-manganese alloys, nickel-manganese alloys, iridium-manganese alloys, nickel oxide and nickel-cobalt oxide) as well as hard bias permanent magnet materials (such as but not limited to cobalt-platinum alloys and cobalt-chromium-platinum alloys). It is significant within the present invention that the patterned longitudinal magnetic biasing layers 20a and 20b bias the patterned magnetoresistive (MR) layer 16a in a longitudinal direction easy axis, as is understood by a person skilled in the art, between the patterned longitudinal magnetic biasing layers 20a and 20b, while the patterned transverse magnetic biasing layer 28a biases the patterned soft adjacent layer (SAL) transverse magnetic biasing layer 26a in a transverse direction perpendicular to the longitudinal direction easy axis in which the patterned magnetoresistive (MR) layer 16a is biased. In order to achieve this result it is typically required that the patterned longitudinal magnetic biasing layers 20a and 20b be formed of a different material than the transverse magnetic biasing layer 28a, such that upon elevated temperature annealing within two sequential perpendicular magnetic fields there may be obtained proper magnetic alignment of the patterned longitudinal magnetic biasing layers 20a and 20b, and the patterned transverse magnetic biasing layer 28a.

In order to optimize performance of a soft adjacent layer (SAL) magnetoresistive (MR) sensor element formed in accord with the present invention, it is important that the thickness of the blanket third dielectric soft adjacent layer (SAL) spacer layer 24 be controlled within the context of a ratio of a magnetic moment of the patterned soft adjacent layer (SAL) transverse magnetic biasing layer 26a to a magnetic moment of the patterned magnetoresistive (MR) layer 16a. For a magnetic moment ratio of the patterned soft adjacent layer (SAL) transverse magnetic biasing layer 26a to the patterned magnetoresistive (MR) layer 16a of from about 0.5 to about 1.0, as is generally achievable within the present invention, a thickness of the blanket third dielectric soft adjacent layer (SAL) spacer layer 24 is preferably from about 50 to about 500 angstroms. At the higher magnetic moment ratio in the range of from about 0.75 to about 1.0, a thickness of the third dielectric soft adjacent layer (SAL) spacer layer 24 of from about 200 to about 500 angstroms is preferred. At the lower magnetic moment ratio in the range of from about 0.5 to about 0.75, a thickness of the third dielectric soft adjacent layer (SAL) spacer layer 24 of from about 50 to about 200 angstroms is preferred.

With respect to the patterned conductor lead layers 22a and 22b, the patterned conductor lead layers 22a and 22b may be formed from any of several conductor materials as are conventional in the art of magnetoresistive (MR) sensor element fabrication, including but not limited to gold, gold alloy, copper, copper alloy, aluminum and aluminum alloy conductor materials.

Referring now to FIG. 2 there is shown a schematic cross-sectional or air bearing surface (ABS) diagram illustrating an additional preferred embodiment of a magnetic read-write head having formed therein a soft adjacent layer (SAL) magnetoresistive (MR) sensor element in accord with the present invention. Shown in FIG. 2 is a schematic cross-sectional diagram of a soft adjacent layer (SAL) magnetoresistive sensor element functionally equivalent to the soft adjacent layer (SAL) magnetoresistive (MR) sensor element whose schematic cross-sectional diagram is illustrated in FIG. 1, but wherein, primarily, the locations of a patterned soft adjacent layer (SAL) transverse magnetic biasing layer 26a' and a blanket magnetoresistive (MR) layer 16' are reversed with respect to the substrate 10. Within the schematic cross-sectional diagram of FIG. 2, the basic reference numeral scheme for the various layers remains equivalent with the reference numeral scheme employed within the soft adjacent layer (SAL) magnetoresistive (MR) sensor element whose schematic cross-sectional diagram is illustrated in FIG. 1, where reference numerals without an alphabetic suffix represent blanket layers and reference numerals with an alphabetic suffix represent patterned layers, but wherein reference numerals with a prime (') within a suffix are directed towards layers whose position or geometry has changed within the second preferred embodiment of the present invention in comparison with the first preferred embodiment of the present invention.

Figure 3:
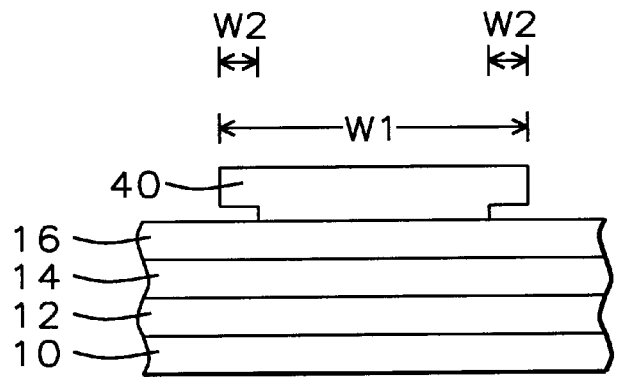
FIG. 3 to FIG. 11 show a series of schematic cross-sectional or air bearing surface (ABS) view diagrams illustrating the results of progressive stages of forming a soft adjacent layer (SAL) magnetoresistive (MR) sensor element in accord with the soft adjacent layer (SAL) magnetoresistive (MR) sensor element whose schematic cross-sectional diagram is illustrated in FIG. 1.

Referring now to FIG. 3 to FIG. 11, there is shown a series of schematic cross-sectional diagrams illustrating the results of progressive stages in forming the soft adjacent layer (SAL) magnetoresistive (MR) sensor element whose schematic cross-sectional diagram is illustrated in FIG. 1. Shown in FIG. 3, is a schematic cross-sectional diagram of the soft adjacent layer (SAL) magnetoresistive (MR) sensor element at an early stage in its fabrication.

Shown in FIG. 3 is the substrate 10 having formed thereover the blanket first shield layer 12 which in turn has formed thereupon the blanket first dielectric layer 14 which in turn has formed thereupon a blanket magnetoresistive (MR) layer 16. Finally, there is shown in FIG. 3 a first lift off stencil 40 formed upon the blanket magnetoresistive (MR) layer 16. Within the first preferred embodiment of the present invention, the blanket first shield layer 12 is preferably formed to a thickness of from about 10000 to about 30000 angstroms upon the substrate 10, while the blanket first dielectric layer 14 is preferably formed to a thickness of from about 300 to about 2000 angstroms upon the blanket first shield layer 12, while in turn the blanket magnetoresistive (MR) layer 16 is preferably formed to a thickness of from about 50 to about 500 angstroms upon the blanket first dielectric layer 14.

Although not specifically illustrated within the schematic cross-sectional diagram of FIG. 3, the first lift off stencil 40 preferably comprises; (1) a patterned first release layer formed upon the blanket magnetoresistive (MR) layer 16; and (2) a patterned first photoresist layer formed symmetrically overhanging upon the patterned first release layer. Such a lift off stencil is disclosed in greater detail within related co-assigned U.S. patent application Ser. No. 09/046,008 filed Mar. 23, 1998, now U.S. Pat. No. 6,007,731, titled "Soft Adjacent Layer (SAL) Magnetoresistive (MR) Sensor Element With Electrically Insulated Soft Adjacent Layer (SAL),", the disclosure of which is incorporated herein fully by reference. While any of several release materials may be employed in forming the patterned first release layer, including but not limited to organic polymer release materials such as but not limited to polysulfone release materials and polyimide release materials, for the first preferred embodiment of the present invention, the patterned first release layer is preferably formed of a polysulfone release material. Preferably, the patterned first release layer is formed to a thickness of from about 500 to about 10000 angstroms upon the blanket magnetoresistive (MR) layer 16. Similarly, although any of several photoresist materials may be employed in forming the patterned first photoresist layer upon the patterned first release layer, including but not limited to photoresist materials selected from the general groups of photoresist materials including but not limited to positive photoresist materials and negative photoresist materials, for the first preferred embodiment of the present invention, the patterned first photoresist layer is preferably formed of a positive photoresist material in order to provide optimal dimensional integrity when forming the first lift off stencil 40. Preferably, the patterned first photoresist layer is formed to a thickness of from about 5000 to about 20000 angstroms upon the patterned first release layer.

In order to fabricate the first lift off stencil 40, there is first formed upon the blanket magnetoresistive (MR) layer 16 a blanket first release layer from which is formed the patterned first release layer. There is then formed upon the blanket first release layer a blanket first photoresist layer from which is formed the patterned first photoresist layer. The patterned first photoresist layer is then photoexposed and developed from the blanket first photoresist layer. Finally, the patterned first release layer is formed through etching the blanket first release layer within an isotropic etchant (typically an organic solvent) for a sufficient time to provide the uniform overhang of the patterned first photoresist layer with respect to the patterned first release layer. Preferably, the patterned first photoresist layer has a width W1 over the blanket magnetoresistive (MR) layer 16 of from about 1 to about 10 microns, as illustrated in FIG. 3, while the patterned first photoresist layer symmetrically overhangs each edge of the patterned first release layer by a width W2 of from about 0.1 to about 2.0 microns, as similarly illustrated in FIG. 3.

Figure 4:
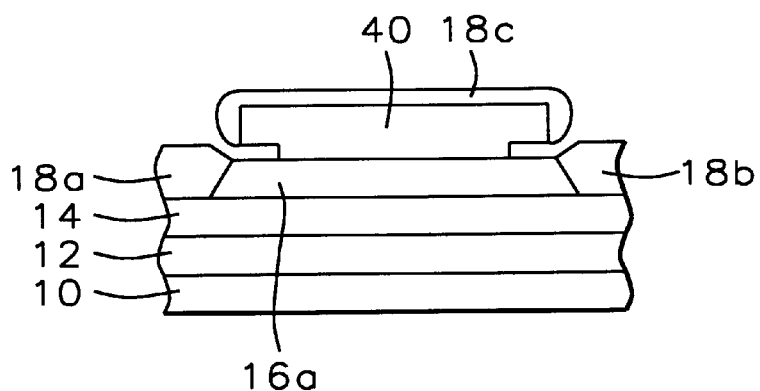

Referring now to FIG. 4, there is shown a schematic cross-sectional diagram illustrating the results of further processing of the soft adjacent layer (SAL) magnetoresistive (MR) sensor element whose schematic cross-sectional diagram is illustrated in FIG. 3.

Shown first in FIG. 4 is the results of etching the blanket magnetoresistive (MR) layer 16 to form the corresponding patterned magnetoresistive (MR) layer 16a, while employing the first lift off stencil 40 as an etch mask. The blanket magnetoresistive (MR) layer 16 may be etched to form the patterned magnetoresistive layer 16a while employing the first lift off stencil 40 as an etch mask while employing etch methods as are conventional in the art of magnetoresistive (MR) sensor element fabrication, such etch methods including but not limited to ion beam etch (IBE) methods, reactive ion beam etch (RIBE) methods, sputter etch methods and reactive sputter etch methods. For the first preferred embodiment of the present invention the blanket magnetoresistive (MR) layer 16 is preferably etched to form the corresponding patterned magnetoresistive (MR) layer 16a through use of an ion beam etch (IBE) method employing argon ions, as is common in the art of magnetoresistive (MR) sensor element fabrication. The ion beam etch (IBE) method preferably etches completely through the blanket magnetoresistive (MR) layer 16 while not substantially etching the blanket first dielectric layer 14. The ion beam etch (IBE) method may be monitored and controlled through use of residual gas analysis methods and optical emission spectroscopy analysis methods as are conventional in the art.

As is illustrated in FIG. 4, the patterned magnetoresistive (MR) layer 16a is typically formed with an outward taper of from about 15 to about 60 degrees with respect to an orthogonal to the substrate 10, as is common in the art of ion beam etch (IBE) methods. Such an outward taper typically occurs due to redeposition upon the first lift off stencil 40 of material sputtered from the blanket magnetoresistive (MR) layer 16 and the redeposited sputtered material's consequential shadowing of the ion beam employed within the ion beam etch (IBE) method. Etch methods other than ion beam etch (IBE) methods may provide the patterned magnetoresistive layer 16a with less taper.

There is also shown in FIG. 4 the presence of: (1) a pair of patterned second dielectric backfill layers 18a and 18b formed upon exposed portions of the blanket first dielectric layer 14; and (2) a patterned second dielectric backfill residue layer 18c formed upon the first lift off stencil 40. The patterned second dielectric backfill layers 18a and 18b and the patterned second dielectric backfill residue layer 18c are preferably formed employing methods and materials analogous or equivalent to the methods and materials employed in forming the blanket first dielectric layer 14 as illustrated in FIG. 1. Preferably, the patterned second dielectric backfill layers 18a and 18b are each formed to a thickness sufficient to fully encapsulate the exposed edges of the patterned magnetoresistive (MR) layer 16a, which will preferably provide patterned second dielectric backfill layers 18a and 18b of from about 100 to about 500 angstroms thickness each. Different deposition methods employed in forming the patterned second dielectric backfill layers 18a and 18b will typically provide slight variations in the level of encapsulation of the exposed edges of the patterned magnetoresistive (MR) layer 16a.

Figure 5:
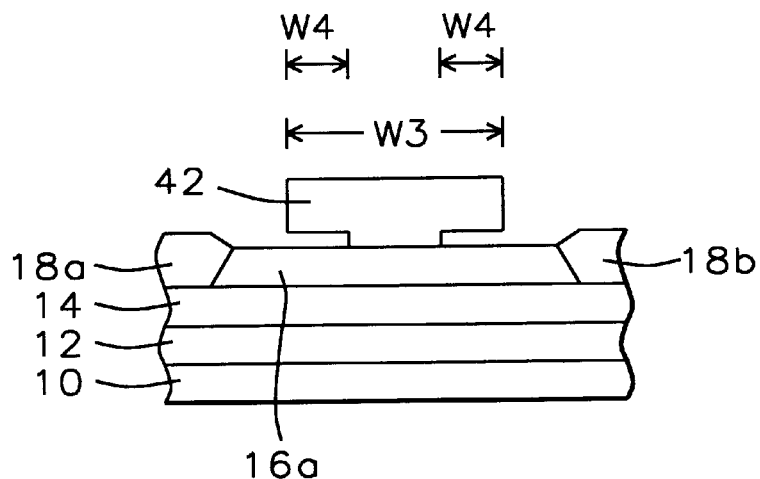

Referring now to FIG. 5, there is shown a schematic cross-sectional diagram illustrating the results of further processing of the soft adjacent layer (SAL) magnetoresistive (MR) sensor element whose schematic cross-sectional diagram is illustrated in FIG. 4. Shown in FIG. 5 is a schematic cross-sectional diagram of a soft adjacent layer (SAL) magnetoresistive (MR) sensor element otherwise equivalent to the soft adjacent layer (SAL) magnetoresistive (MR) sensor element whose schematic cross-sectional diagram is illustrated in FIG. 4, but from whose patterned magnetoresistive (MR) layer 16a has been stripped the first lift off stencil 40, which simultaneously removes with it the patterned second dielectric backfill residue layer 18c. The first lift off stencil 40 is preferably stripped from the soft adjacent layer (SAL) magnetoresistive (MR) sensor element whose schematic cross-sectional diagram is illustrated in FIG. 4 to provide in part the soft adjacent layer (SAL) magnetoresistive (MR) sensor element whose schematic cross-sectional diagram is illustrated in FIG. 5 through use of methods as are conventional in the art of lift off stencil fabrication and removal, which methods will typically employ organic solvent materials, such as but no limited to acetone, tetrahydrofuran (THF) and N-methylpyrrolidone solvent materials.

Also shown within FIG. 5 formed approximately centered upon the patterned magnetoresistive (MR) layer 16a is a second lift off stencil 42. The second lift off stencil 42 is preferably formed employing methods and materials analogous or equivalent to the methods and materials employed in forming the first lift off stencil 40 as illustrated in FIG. 3. Preferably, the second lift off stencil employs a patterned second release layer of thickness from about 500 to about 10000 angstroms having formed thereupon a patterned second photoresist layer of thickness from about 5000 to about 20000 angstroms. Preferably, the patterned second photoresist layer is formed with a width W3 over the patterned magnetoresistive (MR) layer 16a of from about 0.5 to about 5.0 microns, while the patterned second photoresist layer preferably overhangs each edge of the patterned second release by a width W4 preferably from about 0.05 to about 1.0 microns, where W3 and W4 are also illustrated in FIG. 5.

Figure 6:
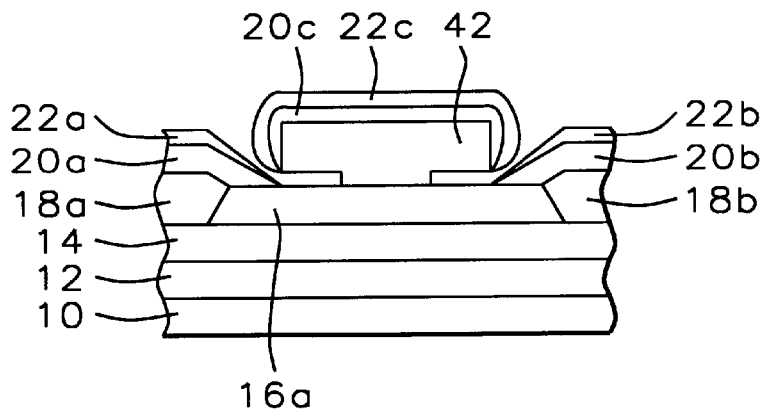

Referring now to FIG. 6, there is shown a schematic cross-sectional diagram illustrating the results of further processing of the soft adjacent layer (SAL) magnetoresistive (MR) sensor element whose schematic cross-sectional diagram is illustrated in FIG. 5. Shown in FIG. 6 is the results of forming upon or over the soft adjacent layer (SAL) magnetoresistive (MR) sensor element whose schematic cross-sectional diagram is illustrated in FIG. 5: (1) a pair of patterned longitudinal magnetic biasing layers 20a and 20b (which as discussed above may under appropriate circumstances be formed of either an antiferromagnetic material or a permanent magnet material) formed upon the corresponding patterned second dielectric backfill layers 18a and 18b and partially overlapping a pair of opposite ends of the patterned magnetoresistive (MR) layer 16a; (2) a pair of patterned conductor lead layers 22a and 22b formed and aligned upon the pair of patterned longitudinal magnetic biasing layers 20a and 20b; and (3) a patterned longitudinal magnetic biasing residue layer 20c having formed thereupon a patterned conductor lead residue layer 22c, both of which are formed upon the second lift off stencil 42. Within the first preferred embodiment of the present invention, the patterned longitudinal magnetic biasing layers 20a and 20b are each preferably formed to a thickness of from about 100 to about 1000 angstroms, while the patterned conductor lead layers are each preferably formed to a thickness of from about 200 to about 2000 angstroms.

As is understood by a person skilled in the art, and although not specifically illustrated within the schematic cross-sectional diagram of FIG. 6, the presence of the patterned longitudinal magnetic biasing layers 20a and 20b is optional within the soft adjacent layer (SAL) magnetoresistive (MR) sensor element formed in accord with the method of the present invention. However, it is common in the art that soft adjacent layer (SAL) magnetoresistive (MR) sensor elements will be fabricated employing patterned longitudinal magnetic biasing layers such as the patterned anti-ferromagnetic longitudinal magnetic biasing layers 28a and 28b.

Figure 7:
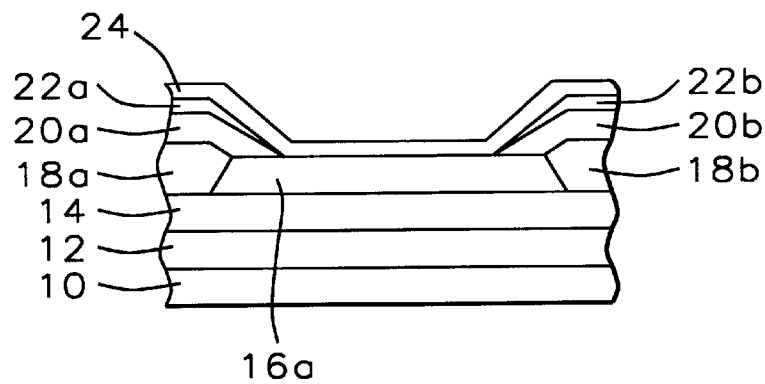

Referring now to FIG. 7, there is shown a schematic cross-sectional diagram illustrating the results of further processing of the soft adjacent layer (SAL) magnetoresistive (MR) sensor element whose schematic cross-sectional diagram is illustrated in FIG. 6. Shown in FIG. 7 is a schematic cross-sectional diagram of a soft adjacent layer (SAL) magnetoresistive (MR) sensor element otherwise equivalent to the soft adjacent layer (SAL) magnetoresistive (MR) sensor element whose schematic cross-sectional diagram is illustrated in FIG. 6, but from whose patterned magnetoresistive (MR) layer 16a is stripped the second lift off stencil 42, simultaneously removing with it the patterned longitudinal magnetic biasing residue layer 20c and the patterned conductor lead residue layer 22c. The second lift off stencil 42 is preferably stripped from the soft adjacent layer (SAL) magnetoresistive (MR) sensor element whose schematic cross-sectional diagram is illustrated in FIG. 6 to provide the soft adjacent layer (SAL) magnetoresistive (MR) sensor element whose schematic cross-sectional diagram is illustrated in FIG. 7 employing methods and materials analogous or equivalent to the methods and materials through which the first lift off stencil 40 is stripped from the soft adjacent layer (SAL) magnetoresistive (MR) sensor element whose schematic cross-sectional diagram is illustrated in FIG. 4 to provide in part the soft adjacent layer (SAL) magnetoresistive (MR) sensor element whose schematic cross-sectional diagram is illustrated in FIG. 5.

There is also shown in FIG. 7, formed upon the patterned conductor lead layers 22a and 22b, and upon exposed portions of the patterned magnetoresistive (MR) layer 16a a blanket third dielectric soft adjacent layer (SAL) spacer layer 24. Within the preferred embodiment of the present invention, the blanket third dielectric soft adjacent layer (SAL) spacer layer 24 is preferably formed employing methods and materials analogous or equivalent to the methods and materials employed in forming the first dielectric layer 14 or the patterned second dielectric backfill layers 18a and 18b. Preferably, the blanket third dielectric soft adjacent layer (SAL) spacer layer 24 is formed to a thickness of from about 50 to about 500 angstroms.

Figure 8:
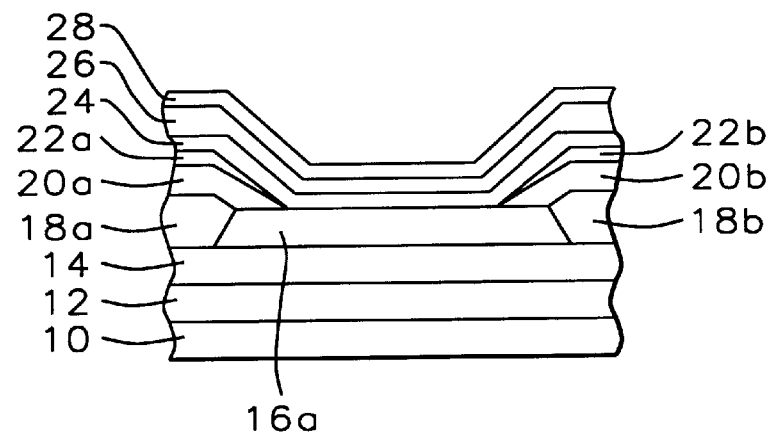

Referring now to FIG. 8, there is shown a schematic cross-sectional diagram illustrating the results of further processing of the soft adjacent layer (SAL) magnetoresistive (MR) sensor element whose schematic cross-sectional diagram is illustrated in FIG. 7. Shown in FIG. 8 is a schematic cross-sectional diagram of a soft adjacent layer (SAL) magnetoresistive (MR) sensor element otherwise equivalent to the soft adjacent layer (SAL) magnetoresistive (MR) sensor element whose schematic cross-sectional diagram is illustrated in FIG. 7, but wherein there is formed upon the blanket third dielectric soft adjacent layer (SAL) spacer layer 24: (1) a blanket soft adjacent layer (SAL) transverse magnetic biasing layer 26, in turn having formed thereupon; (2) a blanket transverse magnetic biasing layer 28. Within the preferred embodiment of the present invention, the blanket soft adjacent layer (SAL) transverse magnetic biasing layer 26 is formed from any one of several soft magnetic materials as noted above. Preferably, the blanket soft adjacent layer (SAL) transverse magnetic biasing layer 26 is formed to a thickness of from about 50 to about 500 angstroms. For the preferred embodiment of the present invention, the blanket transverse magnetic biasing layer 28 is, as noted above, formed from either an antiferromagnetic material or a hard bias permanent magnet material, as noted above, where the choice of material is determined in conjunction with the material from which is formed the patterned longitudinal magnetic biasing layers 20a and 20b. Preferably, the blanket transverse magnetic biasing layer 28 is formed to a thickness of from about 100 to about 500 angstroms.

Figure 9:
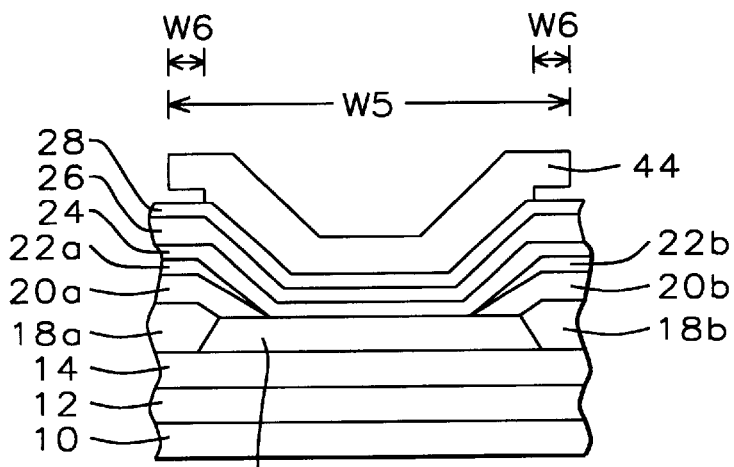

Referring now to FIG. 9, there is shown a schematic cross-sectional diagram illustrating the results of further processing of the soft adjacent layer (SAL) magnetoresistive sensor element whose schematic cross-sectional diagram is illustrated in FIG. 8. Shown in FIG. 9 is a schematic cross-sectional diagram of a soft adjacent layer (SAL) magnetoresistive sensor element otherwise equivalent to the soft adjacent layer (SAL) magnetoresistive sensor element whose schematic cross-sectional diagram is illustrated in FIG. 8, but wherein there is formed upon the blanket transverse magnetic biasing layer 28 a third lift off stencil 44. Within the preferred embodiment of the present invention, the third lift off stencil 44 is preferably formed employing methods and materials analogous or equivalent to the methods and materials employed in forming the first lift off stencil 40 as illustrated within the schematic cross-sectional diagram of FIG. 3 or the second lift off stencil 42 as illustrated within the schematic cross-sectional diagram of FIG. 5. Preferably the third lift off stencil 44 employs a patterned third photoresist layer of width W5 from about 1.0 to about 10.0 microns symmetrically overhanging a patterned third release layer by a width W6 from about 0.05 to about 1.0 microns, where W5 and W6 are illustrated within the schematic cross-sectional diagram of FIG. 9.

Figure 10:
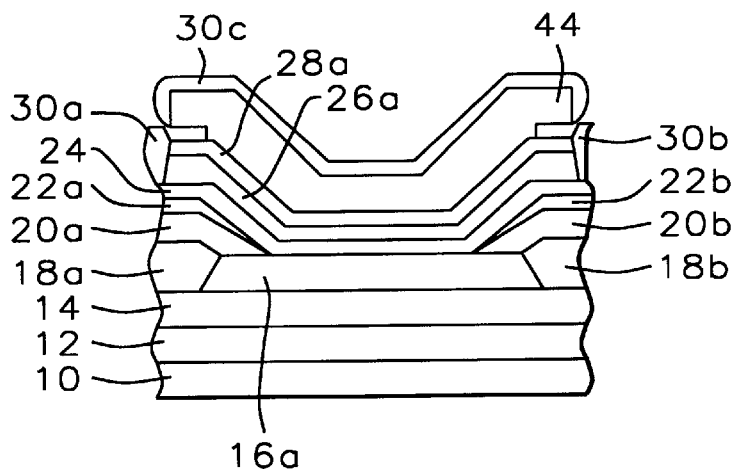

Referring now to FIG. 10, there is shown a schematic cross-sectional diagram illustrating the results of further processing of the soft adjacent layer (SAL) magnetoresistive sensor element whose schematic cross-sectional diagram is illustrated in FIG. 9. Shown in FIG. 10 is a schematic cross-sectional diagram of a soft adjacent layer (SAL) magnetoresistive sensor element otherwise equivalent to the soft adjacent layer magnetoresistive sensor element whose schematic cross-sectional diagram is illustrated in FIG. 9, but wherein: (1) the third lift off stencil 44 is employed as an etch mask for forming from the blanket transverse magnetic biasing layer a patterned transverse magnetic biasing layer 28a and from the blanket soft adjacent layer (SAL) transverse magnetic biasing layer 26 a patterned soft adjacent layer (SAL) transverse magnetic biasing layer 26a; and (2) the third lift off stencil 44 is subsequently employed as a lift off mask for forming a pair of patterned fourth dielectric backfill layers 30a and 30b encapsulating a pair of exposed edges of the patterned soft adjacent layer (SAL) transverse magnetic biasing layer 26a and the patterned transverse magnetic biasing layer 28a while simultaneously forming a patterned fourth dielectric backfill residue layer 30c upon the third lift off stencil 44. The patterned fourth dielectric backfill layers 30a and 30b, and the patterned fourth dielectric backfill residue layer 30c are preferably formed employing methods and materials analogous or equivalent to the methods and materials employed when forming the patterned second dielectric backfill layers 18a and 18b as illustrated within the schematic cross-sectional diagram of FIG. 4. Preferably, the patterned fourth dielectric backfill layers 30a and 30b are each formed to a thickness of from about 200 to about 1000 angstroms.

Figure 11:
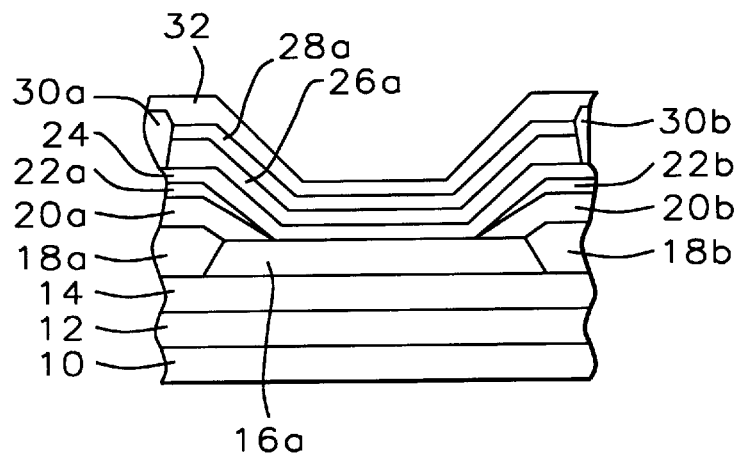

Referring now to FIG. 11, there is shown a schematic cross-sectional diagram illustrating the results of further processing of the soft adjacent layer (SAL) magnetoresistive (MR) sensor element whose schematic cross-sectional diagram is illustrated in FIG. 10. Shown in FIG. 11 is a schematic cross-sectional diagram of a soft adjacent layer (SAL) magnetoresistive (MR) sensor element otherwise equivalent to the soft adjacent layer (SAL) magnetoresistive (MR) sensor element whose schematic cross-sectional diagram is illustrated in FIG. 10, but wherein: (1) the third lift off stencil 44 has been stripped from the soft adjacent layer (SAL) magnetoresistive (MR) sensor element, taking with it the patterned fourth dielectric backfill residue layer 30c; and (2) there is then formed upon the patterned fourth dielectric backfill layers 30a and 30b, and the exposed portion of the patterned transverse magnetic biasing layer 28a, a blanket fifth dielectric layer 32.

Within the first preferred embodiment of the present invention, the third lift off stencil 44 may be stripped from the soft adjacent layer (SAL) magnetoresistive (MR) sensor element whose schematic cross-sectional diagram is illustrated in FIG. 10 to provide in part the soft adjacent layer (SAL) magnetoresistive (MR) sensor element whose schematic cross-sectional diagram is illustrated in FIG. 11 employing methods and materials analogous or equivalent to the methods and materials through which: (1) the first lift off stencil 40 as illustrated within the soft adjacent layer (SAL) magnetoresistive (MR) sensor element whose schematic cross-sectional diagram is illustrated in FIG. 3 or FIG. 4 is stripped to provide in part the soft adjacent layer (SAL) magnetoresistive (MR) sensor element is illustrated in FIG. 5; or alternatively, (2) the second lift off stencil 42 as illustrated within the soft adjacent layer (SAL) magnetoresistive (MR) sensor element whose schematic cross-sectional diagram is illustrated in FIG. 5 or FIG. 6 is stripped to provide in part the soft adjacent layer (SAL) magnetoresistive (MR) sensor element whose schematic cross-sectional diagram is illustrated in FIG. 7.

The soft adjacent layer (SAL) magnetoresistive (MR) sensor element whose schematic cross-sectional diagram is illustrated in FIG. 11 may be further fabricated to form therefrom the magnetic read-write head whose schematic cross-sectional diagram is illustrated in FIG. 1, while employing additional methods and materials as are conventional in the art of magnetoresistive (MR) sensor element fabrication and magnetic read-write head fabrication. In that regard, the blanket second shield layer 34 as formed upon the blanket fifth dielectric layer 32 as illustrated within the schematic cross-sectional diagram of FIG. 1, which blanket second shield layer 34 simultaneously serves as a first magnetic inductor pole layer, is preferably formed upon the blanket fifth dielectric layer 32 to a thickness of from about 10000 to about 40000 angstroms. Similarly, the blanket sixth dielectric gap fill layer 36 as illustrated within the schematic cross-sectional diagram of FIG. 1 is preferably formed upon the blanket second shield layer 34 to a thickness of from about 1000 to about 5000 angstroms. Finally, the patterned second magnetic inductor pole layer 38a as is illustrated within the schematic cross-sectional diagram of FIG. 1, is preferably formed to a thickness of from about 10000 to about 40000 angstroms upon the blanket sixth dielectric gap fill layer 36.

As an optional feature of a soft adjacent layer (SAL) magnetoresistive (MR) sensor element formed in accord with the method of the present invention, there may also be trimmed portions of the patterned magnetoresistive (MR) layer 16a, the blanket third dielectric layer soft adjacent layer (SAL) spacer layer 24, the patterned soft adjacent layer (SAL) transverse magnetic biasing layer 26a and the patterned transverse magnetic biasing layer 28a within the trackwidth of the soft adjacent layer (SAL) magnetoresistive (MR) sensor element at a location opposite the air bearing surface (ABS) of the soft adjacent layer (SAL) magnetoresistive (MR) sensor element. The location where such trimming is to occur is illustrated within the schematic cross-sectional diagram of FIG. 12. Such trimming effects an optimal bias angle for the patterned magnetoresistive (MR) layer 16a, which results in better signal output insofar as the magnetoresistive (MR) sensor element is then biased at about 45 degrees which provides an adequate magnetic moment ratio between the soft adjacent layer (SAL) and the magnetoresistive (MR) layer within the soft adjacent layer (SAL) magnetoresistive (MR) sensor element.

Figure 12:
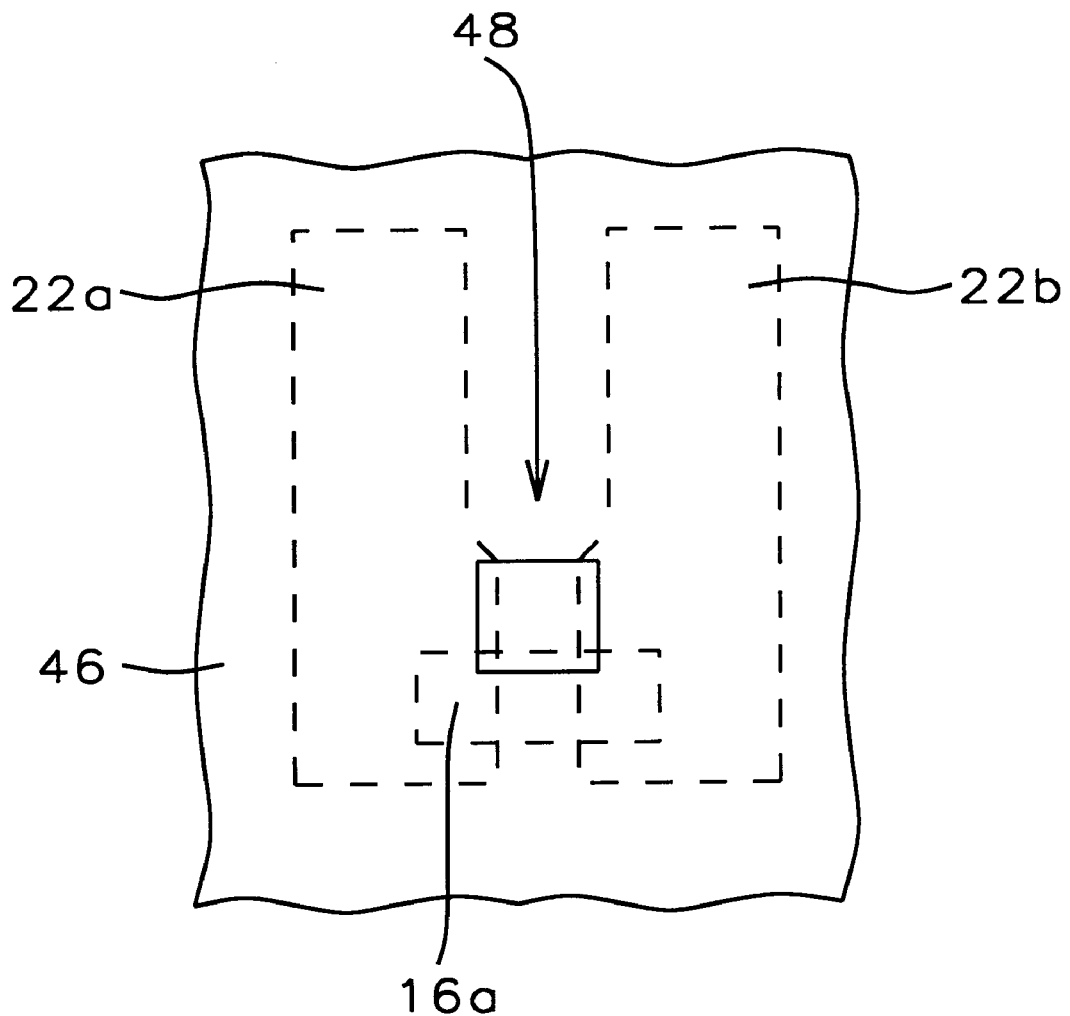
FIG. 12 shows a schematic plan view diagram illustrating a magnetoresistive (MR) layer, dielectric spacer layer, soft adjacent layer (SAL) and transverse magnetic biasing layer trimming option which may be employed within a soft adjacent layer (SAL) magnetoresistive (MR) sensor element formed in accord with the present invention.

For clarity, FIG. 12 is assumed as a plan-view diagram corresponding with the schematic cross-sectional diagram of FIG. 11. Only the outlines of the patterned conductor lead layers 20a and 20b, and the patterned magnetoresistive layer 16a are shown, also for clarity. It is assumed that there is employed a fourth lift off stencil 46 having formed therein a window 48 exposing the portion of the soft adjacent layer (SAL) magnetoresistive (MR) sensor element desired to be trimmed to assure enhanced performance. Subsequent to trimming of the patterned magnetoresistive (MR) layer 16a, the blanket third dielectric soft adjacent layer (SAL) spacer layer 24, the patterned soft adjacent layer (SAL) transverse magnetic biasing layer 26a and the patterned transverse magnetic biasing layer 28a to be co-extensive within the trimmed region defined by the window 48, the soft adjacent layer (SAL) magnetoresistive sensor element may be back-filled with a patterned seventh dielectric backfill layer while employing the fourth lift off stencil 46 as a lift off mask.

As is understood by a person skilled in the art, there may be employed within the soft adjacent layer (SAL) magnetoresistive (MR) read-write head whose schematic cross-sectional diagram is illustrated in FIG. 1 or FIG. 2 additional layers as are conventionally required or desired for additional fabrication of the soft adjacent layer (SAL) magnetoresistive (MR) read-write head whose schematic cross-sectional diagram is illustrated in FIG. 1 or FIG. 2. Such additional layers may include, but are not limited to, additional shield layers, additional dielectric layers, additional magnetic inductor layers, conductor layers, interconnection layers and passivation layers. Such additional layers may be formed employing methods, materials and dimensions equivalent to the methods, materials and dimensions conventionally employed when forming those additional layers within magnetoresistive (MR) read-write heads.

Finally, as is also similarly understood by a person skilled in the art, the preferred embodiments of the present invention are illustrative of the present invention rather than limiting of the present invention. Revisions and modifications may be made to materials, structures and dimensions through which is provided the soft adjacent layer (SAL) magnetoresistive (MR) sensor elements of the preferred embodiments of the present invention while still providing a soft adjacent layer (SAL) magnetoresistive (MR) sensor element within the spirit and scope of the present invention, as defined by the accompanying claims.

What is claimed is:

1. A method for fabricating a magnetoresistive (MR) sensor element comprising:

providing a substrate;

forming over the substrate a dielectric layer, the dielectric layer having a first surface of the dielectric layer and a second surface of the dielectric layer opposite the first surface of the dielectric layer;

forming over the substrate a magnetoresistive (MR) layer contacting the first surface of the dielectric layer;

forming over the substrate a soft adjacent layer (SAL), the soft adjacent layer (SAL) having a first surface of the soft adjacent layer (SAL) and a second surface of the soft adjacent layer (SAL) opposite the first surface of the soft adjacent layer (SAL), the first surface of the soft adjacent layer (SAL) contacting the second surface of the dielectric layer; and forming over the substrate a transverse magnetic biasing layer, the transverse magnetic biasing layer contacting the second surface of the soft adjacent layer (SAL), where at least one of the dielectric layer, the magnetoresistive (MR) layer, the soft adjacent layer (SAL) and the transverse magnetic biasing layer is a patterned layer formed employing an etch mask which serves as a lift-off stencil for forming a patterned second dielectric layer adjoining an edge of the patterned layer.

2. The method of claim 1 wherein the magnetoresistive (MR) layer is formed interposed between the soft adjacent layer (SAL) and the substrate.

3. The method of claim 1 wherein the soft adjacent layer (SAL) is formed interposed between the magnetoresistive (MR) layer and the substrate.

4. The method of claim 1 wherein the soft adjacent layer (SAL) is formed from a soft magnetic material selected from the group consisting of nickel-iron alloys, higher order alloys incorporating nickel-iron alloys and cobalt-zirconium amorphous alloys.

5. The method of claim 1 wherein the transverse magnetic biasing layer is formed from a hard magnetic material selected from:

the group of antiferromagnetic materials consisting of iron-manganese alloys, nickel-manganese alloys, nickel oxide, nickel-cobalt oxide; and the group of permanent magnet materials consisting of cobalt-platinum alloys and cobalt-chromium-platinum alloys.

6. The method of claim 1 wherein the transverse magnetic biasing layer induces within the soft adjacent layer (SAL) a transverse magnetic field perpendicular to a longitudinal easy axis magnetic field induced within the magnetoresistive (MR) layer.

7. The method of claim 1 wherein:

a ratio of a magnetic moment of the soft adjacent layer (SAL) to a magnetic moment of the magnetoresistive (MR) layer is from about 0.5 to about 1.0; and a thickness of the dielectric layer is from about 50 to about 500 angstroms.

8. The method of claim 1 wherein the dielectric layer, the magnetoresistive (MR) layer, the soft adjacent layer (SAL) and the transverse magnetic biasing layer are coextensive within a trackwidth of the soft adjacent layer (SAL) magnetoresistive (MR) sensor element at a location opposite the air bearing surface (ABS) of the soft adjacent layer (SAL) magnetoresistive (MR) sensor element.

* * * * *